US012640760B2

(12) United States Patent
Tanaka et al.

(10) Patent No.: US 12,640,760 B2
(45) Date of Patent: May 26, 2026

(54) RADIO-FREQUENCY CIRCUIT AND COMMUNICATION DEVICE

(71) Applicant: Murata Manufacturing Co., Ltd., Nagaokakyo (JP)

(72) Inventors: Satoshi Tanaka, Nagaokakyo (JP); Satoshi Sakurai, Nagaokakyo (JP); Hirotsugu Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 302 days.

(21) Appl. No.: 18/619,214

(22) Filed: Mar. 28, 2024

(65) Prior Publication Data

US 2024/0243765 A1      Jul. 18, 2024

Related U.S. Application Data

(63) Continuation of application No. PCT/JP2022/034177, filed on Sep. 13, 2022.

(30) Foreign Application Priority Data

Oct. 6, 2021      (JP) ................................. 2021-164623

(51) Int. Cl.
H04B 1/04          (2006.01)
H03F 1/02          (2006.01)
(52) U.S. Cl.
CPC ............. H04B 1/04 (2013.01); H03F 1/0205 (2013.01); H04B 2001/0425 (2013.01)
(58) Field of Classification Search
CPC ............. H04B 1/04; H04B 2001/0425; H04B 1/0475; H04B 7/0413; H03F 1/0205; H03F 1/32; H03F 3/24
See application file for complete search history.

(56) References Cited

U.S. PATENT DOCUMENTS 12,095,489 B2 *    9/2024    Tsuda ................... H04B 1/0483
12,273,077 B2 *    4/2025    Tokuda ................... H03F 3/195
(Continued)

FOREIGN PATENT DOCUMENTS

JP        2005-348116 A      12/2005
JP        2006-295282 A      10/2006
(Continued)

OTHER PUBLICATIONS

International Search Report and Written Opinion mailed on Dec. 13, 2022, received for PCT Application PCT/JP2022/034177, filed on Sep. 13, 2022, 9 pages including English Translation.

*Primary Examiner* — Angelica Perez
(74) *Attorney, Agent, or Firm* — XSENSUS LLP

(57)          ABSTRACT

A radio-frequency circuit is capable of performing either uplink MIMO or uplink non-MIMO of a first band. The radio-frequency circuit includes a first power amplifier capable of amplifying a signal in the first band, a first circuit capable of adjusting linearity of output power with respect to input power into the first power amplifier, a second power amplifier capable of amplifying a signal in the first band, and a second circuit capable of adjusting linearity of output power with respect to input power into the second power amplifier. Assuming the uplink MIMO is performed using a first transmission signal output from the first power amplifier and a second transmission signal output from the second power amplifier, saturated output powers of the first power amplifier and the second power amplifier are increased due to the first circuit and the second circuit.

17 Claims, 7 Drawing Sheets

(56)          References Cited

U.S. PATENT DOCUMENTS

| | | | | |
|---|---|---|---|---|
| 2005/0272382 A1* | 12/2005 | Amano | ............... | H04B 7/0697 |
| | | | | 455/101 |
| 2006/0246855 A1* | 11/2006 | Kato | ......................... | H03F 3/24 |
| | | | | 455/102 |
| 2006/0250182 A1* | 11/2006 | Takeda | ...................... | H03F 3/24 |
| | | | | 330/129 |
| 2008/0125061 A1* | 5/2008 | Kuriyama | ................. | H03F 3/24 |
| | | | | 455/127.1 |
| 2019/0273519 A1* | 9/2019 | Shinozaki | ................ | H04B 1/48 |

FOREIGN PATENT DOCUMENTS

| | | | |
|---|---|---|---|
| JP | 2006-311485 A | 11/2006 |
| JP | 2012-222623 A | 11/2012 |
| JP | 6580488 B2 | 9/2019 |
| JP | 6846444 B | 3/2021 |
| WO | 2019/065419 A1 | 4/2019 |

* cited by examiner

IN MIMO (SMALL R$_{LOAD}$)

L2a<L2b
C2a>C2b

IN NON-MIMO

L2a<L2b
C2a>C2b

RADIO-FREQUENCY CIRCUIT AND COMMUNICATION DEVICE

CROSS-REFERENCE TO RELATED APPLICATIONS

This is a continuation application of PCT International Application No. PCT/JP2022/034177 filed on Sep. 13, 2022, designating the United States of America, which is based on and claims priority of Japanese Patent Application No. 2021-164623 filed on Oct. 6, 2021. The entire disclosures of the above-identified applications, including the specifications, drawings, and claims are incorporated herein by reference in their entirety.

BACKGROUND OF THE INVENTION

1. Field of the Invention

The present invention relates to a radio-frequency circuit and a communication device.

2. Description of the Related Art

A multiple-input multiple-output (MIMO) method is adopted for a communication terminal, such as a cellular phone. MIMO is a technique for performing spatial multiplexing and transmission-reception of multiple signals using multiple antennas to improve the communication speed.

International Publication No. 2019/065419 discloses a radio-frequency module including a first primary or diversity circuit and a second MIMO circuit.

However, when uplink MIMO is performed in a compact mobile terminal, such as a mobile phone, it is difficult to ensure sufficient isolation between multiple transmission paths. Accordingly, there is a problem in that spurious waves caused by nonlinear distortion occur on the multiple transmission paths.

SUMMARY OF THE INVENTION

Accordingly, in order to resolve the above problem, the present invention provides a radio-frequency circuit and a communication device having suppressed occurrence of spurious waves caused by nonlinear distortion in uplink MIMO.

A radio-frequency circuit according to an aspect of the present invention is capable of performing uplink MIMO of a first band. The radio-frequency circuit includes a first power amplifier capable of amplifying a signal in the first band, a first circuit capable of adjusting linearity of output power with respect to input power into the first power amplifier, a second power amplifier capable of amplifying a signal in the first band, and a second circuit capable of adjusting linearity of output power with respect to input power into the second power amplifier. Assuming the uplink MIMO is performed using a first transmission signal output from the first power amplifier and a second transmission signal output from the second power amplifier, saturated output powers of the first power amplifier and the second power amplifier are increased due to the first circuit and the second circuit.

According to the present invention, it is possible to provide a radio-frequency circuit and a communication device having suppressed occurrence of spurious waves caused by nonlinear distortion in the uplink MIMO.

DESCRIPTION OF THE PREFERRED EMBODIMENTS

Figure 1:
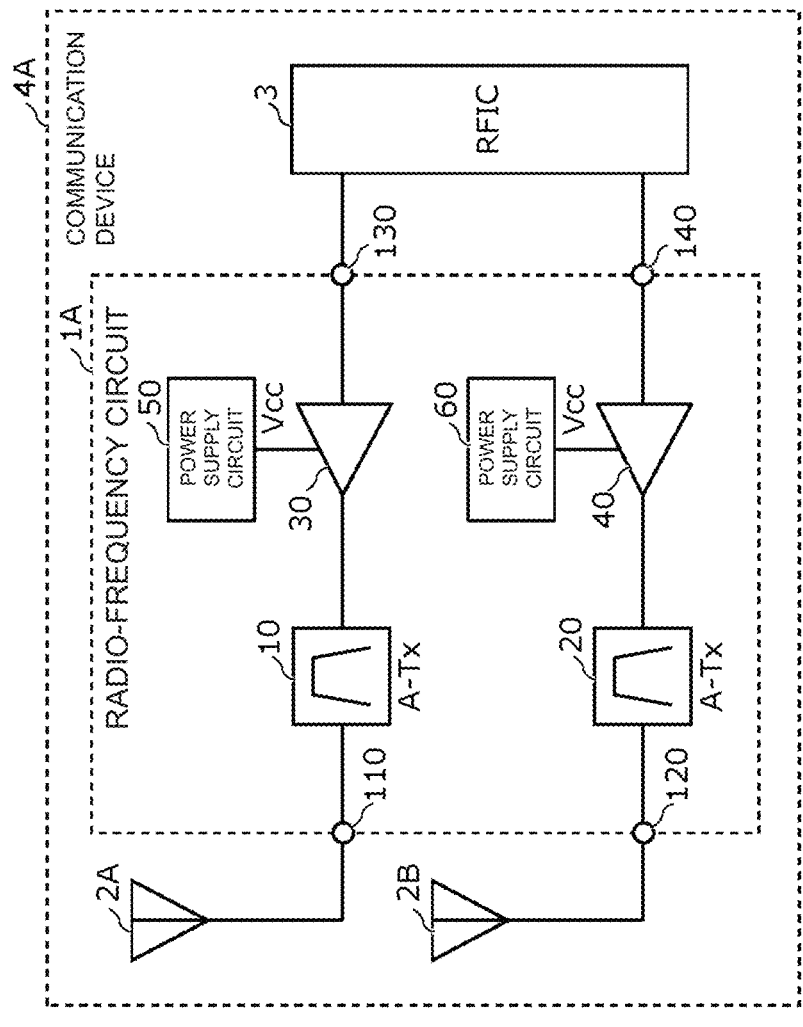
FIG. 1 is a diagram illustrating the circuit configurations of a radio-frequency circuit and a communication device according to a first example.

Embodiments of the present invention will herein be described in detail with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present invention.

The respective drawings are schematic diagrams appropriately subjected to emphasis, omission, or adjustment of ratios in order to describe the present invention. The respective drawings are not necessarily strictly illustrated and may be different from the actual shapes, positional relationship, and ratios. The same reference numerals and letters are used in the respective drawings to identify substantially the same components and a duplicated description of such components may be omitted or simplified.

In the embodiments described above, "connected" includes not only direct connection with a connection terminal and/or a wiring conductor but also electrical connection via another circuit element. "Connected between A and B" means connection to both A and B between A and B and includes parallel connection (shunt connection) between a path between A and B and ground, in addition to series connection on the path between A and B.

In the embodiments described above, a "transmission path" means a transmission line composed of wiring through which a radio-frequency transmission signal is propagated, electrodes directly connected to the wiring, terminals directly connected to the wiring or the electrodes, and so on. A "reception path" means a transmission line composed of wiring through which a radio-frequency reception signal is propagated, electrodes directly connected to the wiring, terminals directly connected to the wiring or the electrodes, and so on.

Embodiments

1. Circuit Configurations of Radio-Frequency Circuit 1A and Communication Device 4A According to First Example The circuit configurations of a radio-frequency circuit 1A and a communication device 4A according to a first example will now be described with reference to FIG. 1. FIG. 1 is a diagram illustrating the circuit configurations of the radio-frequency circuit 1A and the communication device 4A according to the first example.

1.1 Circuit Configuration of Communication Device 4A

First, the circuit configuration of the communication device 4A will be described. As illustrated in FIG. 1, the communication device 4A according to the first example includes the radio-frequency circuit 1A, antennas 2A and 2B, a radio-frequency (RF) signal processing circuit (radio-frequency integrated circuit (RFIC)) 3.

The radio-frequency circuit 1A transmits a radio-frequency signal between the antennas 2A and 2B and the RFIC 3. The circuit configuration of the radio-frequency circuit 1A will be described below.

The antenna 2A is connected to an antenna connection terminal 110 of the radio-frequency circuit 1A. The radio-frequency signal output from the radio-frequency circuit 1A is transmitted from the antenna 2A and the radio-frequency signal is received from the outside of the radio-frequency circuit 1A through the antenna 2A to be supplied to the radio-frequency circuit 1A. The antenna 2B is connected to an antenna connection terminal 120 of the radio-frequency circuit 1A. The radio-frequency signal output from the radio-frequency circuit 1A is transmitted from the antenna 2B and the radio-frequency signal is received from the outside of the radio-frequency circuit 1A through the antenna 2B to be supplied to the radio-frequency circuit 1A.

The RFIC 3 is an example of a signal processing circuit that processes the radio-frequency signal. Specifically, the RFIC 3 performs signal processing, such as down-conversion, to a reception signal input through a reception path of the radio-frequency circuit 1A and supplies the reception signal resulting from the signal processing to a baseband signal processing circuit (baseband integrated circuit (BBIC)) (not illustrated). In addition, the RFIC 3 performs signal processing, such as up-conversion, to a transmission signal input from the BBIC and supplies the transmission signal resulting from the signal processing to a transmission path of the radio-frequency circuit 1A. The RFIC 3 includes a control unit that controls power supply circuits, amplifiers, switches, and so on in radio-frequency circuit 1A. Part or all of the functions of the RFIC 3 serving as the control unit may be provided outside the RFIC 3. For example, part or all of the functions of the RFIC 3 serving as the control unit may be provided in the BBIC or the radio-frequency circuit 1A.

The RFIC 3 is connected to radio-frequency input terminals 130 and 140 of the radio-frequency circuit 1A and supplies a MIMO signal and a non-MIMO signal in Band A (a first band) to the radio-frequency circuit 1A.

The antennas 2A and 2B are not essential components in the communication device 4A according to the first example.

1.2 Circuit Configuration of Radio-Frequency Circuit 1A

Next, the circuit configuration of the radio-frequency circuit 1A will be described. As illustrated in FIG. 1, the radio-frequency circuit 1A includes power amplifiers 30 and 40, power supply circuits 50 and 60, filters 10 and 20, the antenna connection terminals 110 and 120, and the radio-frequency input terminals 130 and 140.

The filter 10 is an example of a first filter and includes at least part of Band A (the first band) in its passband. The filter 10 is connected between the antenna connection terminal 110, which is an example of a first antenna connection terminal, and an output terminal of the power amplifier 30.

The filter 20 is an example of a second filter and includes at least part of Band A (the first band) in its passband. The filter 20 is connected between the antenna connection terminal 120, which is an example of a second antenna connection terminal, and an output terminal of the power amplifier 40.

Assuming Band A is a band for frequency division duplex (FDD), each of the filters 10 and 20 includes an uplink operating band of Band A in its passband.

Assuming Band A is a band for time division duplex (TDD), each of the filters 10 and 20 includes Band A in its passband.

The uplink operating band means a frequency range specified for uplink, among the above bands. The downlink operating band means a frequency range specified for downlink, among the above bands.

The power amplifier 30 is an example of a first power amplifier and is capable of amplifying the transmission signal in Band A supplied from the RFIC 3 through the radio-frequency input terminal 130. The power amplifier 30 is connected between the filter 10 and the radio-frequency input terminal 130.

The power amplifier 40 is an example of a second power amplifier and is capable of amplifying the transmission signal in Band A supplied from the RFIC 3 through the radio-frequency input terminal 140. The power amplifier 40 is connected between the filter 20 and the radio-frequency input terminal 140.

The power amplifiers 30 and 40 are each composed of, for example, a bipolar amplifier transistor having a base terminal, an emitter terminal, and a collector terminal. The amplifier transistors composing the power amplifiers 30 and 40 are not limited to the bipolar transistors and may be, for example, metal-oxide-semiconductor field-effect transistors (MOSFETs).

Assuming the power amplifiers 30 and 40 are common-emitter bipolar transistors, direct-current power supply voltage (Vcc) is supplied to the collector terminal of each amplifier transistor. For example, varying the direct-current power supply voltage to be supplied to the collector terminal of each amplifier transistor varies the linearity of each amplifier transistor.

Band A means a frequency band for a communication system that is built using a radio access technology (RAT), which is defined in advance by standardizing bodies or the likes (for example, 3rd Generation Partnership Project (3GPP) (registered trademark) and Institute of Electrical and Electronics Engineers (IEEE)). Although, for example, a 4th Generation (4G)-Long Term Evolution (LTE) system, a 5th Generation (5G)-New Radio (NR) system, a Wireless Local Area Network (WLAN) system, or the like is usable as the communication system in the present embodiment, the communication system is not limited to the above ones.

Assuming Band A is for the FDD, Band A is any of, for example, Band 1, Band 3, Band 8, Band 20, Band 28, and Band 71 for the 4G-LTE and Band n1 (the uplink operating band: 1,920 MHz to 1,980 MHz and the downlink operating band: 2,110 MHz to 2,170 MHz), Band n3 (the uplink operating band: 1,710 MHz to 1,785 MHz and the downlink operating band: 1,805 MHz to 1,880 MHz), Band n8 (the uplink operating band: 880 MHz to 915 MHz and the downlink operating band 925 MHz to 960 MHz), Band n20 (the uplink operating band: 832 MHz to 862 MHz and the downlink operating band: 791 MHz to 821 MHz), Band n28 (the uplink operating band: 703 MHz to 748 MHz and the downlink operating band: 758 MHz to 803 MHz), and Band n71 (the uplink operating band: 663 MHz to 698 MHz and the downlink operating band: 617 MHz to 652 MHz) for the 5G-NR.

Assuming Band A is for the TDD, Band A is any of, for example, Band 40, Band 41, and Band 46 for the 4G-LTE and Band n40 (2,300 MHz to 2,400 MHz), Band n41 (2,496 MHz to 2,690 MHz), Band n46 (5,150 MHz to 5,925 MHz), Band n77 (3,300 MHz to 4,200 MHz), Band n78 (3,300 MHz to 3,800 MHz), Band n79 (4,400 MHz to 5,000 MHz), Band n96 (5,925 MHz to 7,125 MHz), Band n102 (5,925 MHz to 6,425 MHz), and Band n104 (6,425 MHz to 7,125 MHz) for the 5G-NR.

The power supply circuit 50 is an example of a first circuit. The power supply circuit 50 is connected to the power amplifier 30 and supplies power supply voltage Vcc1 (first power supply voltage) having a variable voltage level to the power amplifier 30. With this configuration, the power supply circuit 50 is capable of adjusting the linearity of output power with respect to input power into the power amplifier 30.

The power supply circuit 60 is an example of a second circuit. The power supply circuit 60 is connected to the power amplifier 40 and supplies power supply voltage Vcc2 (second power supply voltage) having a variable voltage level to the power amplifier 40. With this configuration, the power supply circuit 60 is capable of adjusting the linearity of output power with respect to input power into the power amplifier 40.

Assuming uplink MIMO of Band A is performed, multiple transmission signals in Band A are transmitted using the same channel in Band A. Accordingly, there is a problem in that spurious waves caused by nonlinear distortion are likely to occur on multiple transmission paths, compared with non-MIMO communication.

In contrast, in the radio-frequency circuit 1A according to the first example, assuming the uplink MIMO of Band A is performed using a first transmission signal output from the power amplifier 30 and a second transmission signal output from the power amplifier 40 in the power supply circuit 50, the power supply voltage Vcc1 is increased and the power supply voltage Vcc2 is increased, compared with those assuming the uplink non-MIMO is performed. Accordingly, assuming the uplink MIMO is performed, saturated output powers of the power amplifiers 30 and 40 are increased.

In other words, in the uplink MIMO described above, increasing the saturated output powers of the power amplifiers 30 and 40 enables the spurious waves caused by nonlinear distortion, which occurs due to mutual interference between the first transmission signal and the second transmission signal, to be suppressed. Accordingly, it is possible to improve the quality of the transmission signal in the uplink MIMO.

In the present embodiment, the saturated output power is defined as an output power level at which the inclination of a curve indicating the relationship between the input power and the output power is varied from a positive value to zero on an input power-output power characteristic of the power amplifier.

Instead of the above definition, a third-order intercept point, which is an evaluation parameter of distortion characteristics, may be used as the saturated output power.

Assuming the one transmission signal in Band A is output from the radio-frequency circuit 1A (non-MIMO), the transmission signal in Band A is transmitted from the antenna 2A through the RFIC 3, the radio-frequency input terminal 130, the power amplifier 30, the filter 10, and the antenna connection terminal 110. At this time, no transmission signal in Band A is transmitted through the radio-frequency input terminal 140, the power amplifier 40, the filter 20, and the antenna connection terminal 120. In this case, the power supply voltage Vcc1 is decreased and the power supply voltage Vcc2 is decreased, compared with those assuming the uplink MIMO is performed.

Assuming two transmission signals in Band A are subjected to intra-band contiguous carrier aggregation (CA) (the non-MIMO) using two continuous channels (component carriers) of Band A, the two transmission signals are output from the antenna 2A through the RFIC 3, the radio-frequency input terminal 130, the power amplifier 30, the filter 10, and the antenna connection terminal 110. At this time, no transmission signal in Band A is transmitted through the radio-frequency input terminal 140, the power amplifier 40, the filter 20, and the antenna connection terminal 120. In this case, the power supply voltage Vcc1 is decreased and the power supply voltage Vcc2 is decreased, compared with those assuming the uplink MIMO is performed.

Assuming two transmission signals in Band A are subjected to intra-band non-contiguous CA (the non-MIMO) using two non-continuous channels (component carriers) of Band A, one of the two transmission signals is output from the antenna 2A through the RFIC 3, the radio-frequency input terminal 130, the power amplifier 30, the filter 10, and the antenna connection terminal 110, and the other of the two transmission signals is output from the antenna 2B through the RFIC 3, the radio-frequency input terminal 140, the power amplifier 40, the filter 20, and the antenna connection terminal 120. In this case, the power supply voltage Vcc1 is decreased and the power supply voltage Vcc2 is decreased, compared with those assuming the uplink MIMO is performed.

Figure 2:
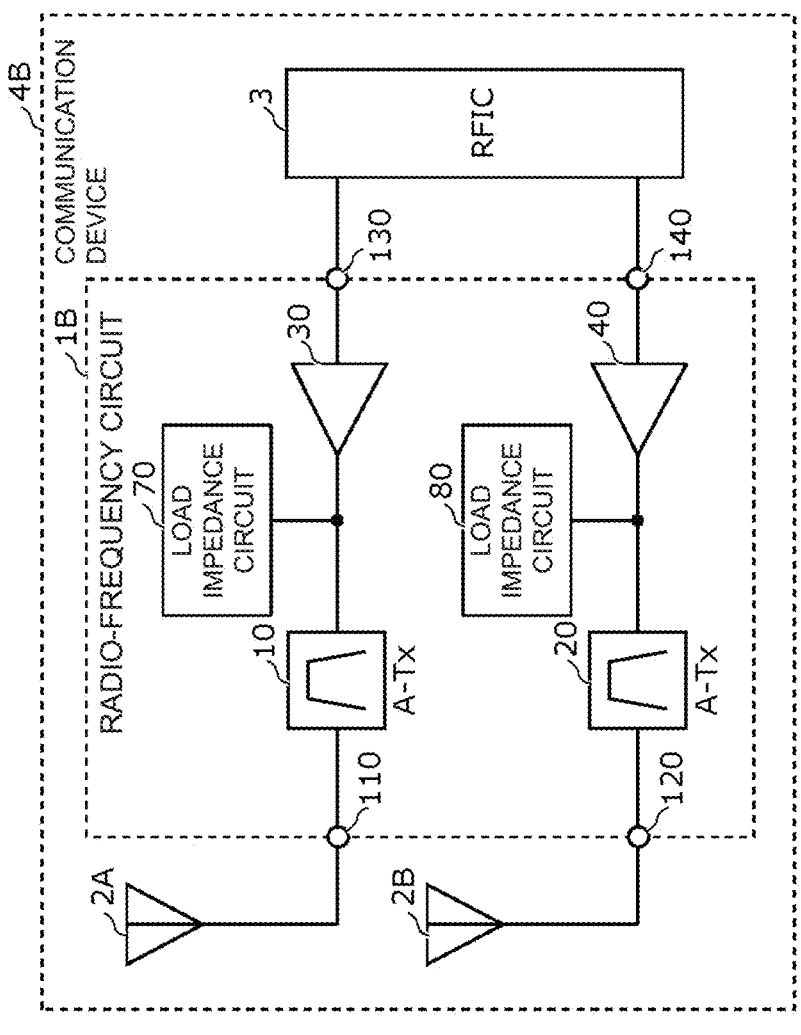
FIG. 2 is a diagram illustrating the circuit configurations of a radio-frequency circuit and a communication device according to a second example.

2. Circuit Configurations of Radio-Frequency Circuit 1B and Communication Device 4B According to Second Example The circuit configurations of a radio-frequency circuit 1B and a communication device 4B according to a second example will now be described with reference to FIG. 2. FIG. 2 is a diagram illustrating the circuit configurations of the radio-frequency circuit 1B and the communication device 4B according to the second example.

2.1 Circuit Configuration of Communication Device 4B

First, the circuit configuration of the communication device 4B will be described. As illustrated in FIG. 2, the communication device 4B according to the second example includes the radio-frequency circuit 1B, the antennas 2A and 2B, and the RFIC 3. The communication device 4B according to the second example differs from the communication device 4A according to the first example only in the configuration of the radio-frequency circuit 1B. Accordingly, the following description focuses on the configuration of the radio-frequency circuit 1B in the communication device 4B according to the second example.

2.2 Circuit Configuration of Radio-Frequency Circuit 1B

Next, the circuit configuration of the radio-frequency circuit 1B will be described. As illustrated in FIG. 2, the radio-frequency circuit 1B includes the power amplifiers 30 and 40, load impedance circuits 70 and 80, the filters 10 and 20, the antenna connection terminals 110 and 120, and the radio-frequency input terminals 130 and 140. The radio-frequency circuit 1B according to the second example differs from the radio-frequency circuit 1A according to the first example only in the configuration of the load impedance circuits 70 and 80. Accordingly, a description of the same points of the radio-frequency circuit 1B according to the second example as those of the radio-frequency circuit 1A according to the first example is omitted, and the following description focuses on points different from the radio-frequency circuit 1A according to the first example.

The load impedance circuit 70 is an example of the first circuit. The load impedance circuit 70 is connected between the filter 10 and the power amplifier 30 and adjusts imped-ance matching between the power amplifier 30 and the filter 10. With this configuration, the load impedance circuit 70 is capable of adjusting the linearity of the output power with respect to the input power into the power amplifier 30. For example, assuming the impedance of the load impedance circuit 70 is made low, the linearity of the power amplifier 30 is improved and the saturated output power is increased.

The load impedance circuit 80 is an example of the second circuit. The load impedance circuit 80 is connected between the filter 20 and the power amplifier 40 and adjusts imped-ance matching between the power amplifier 40 and the filter 20. With this configuration, the load impedance circuit 80 is capable of adjusting the linearity of the output power with respect to the input power into the power amplifier 40. For example, assuming the impedance of the load impedance circuit 80 is made low, the linearity of the power amplifier 40 is improved and the saturated output power is increased.

With the radio-frequency circuit 1B according to the second example, assuming the uplink MIMO of Band A is performed using the first transmission signal output from the power amplifier 30 and the second transmission signal output from the power amplifier 40, the impedance of the load impedance circuit 70 and the impedance of the load impedance circuit 80 are different from those assuming the uplink non-MIMO is performed.

With this configuration, in the uplink MIMO, the imped-ance of the load impedance circuit 70 assuming the power amplifier 30 side is viewed is capable of being decreased, compared with that in the non-MIMO. In addition, in the uplink MIMO, the impedance of the load impedance circuit 80 assuming the power amplifier 40 side is viewed is capable of being decreased, compared with that in the non-MIMO. In other words, increasing the saturated output powers of the power amplifiers 30 and 40 enables the spurious waves caused by nonlinear distortion, which occurs in the uplink MIMO, to be suppressed. Accordingly, it is possible to improve the quality of the transmission signal in the uplink MIMO.

Figure 3:
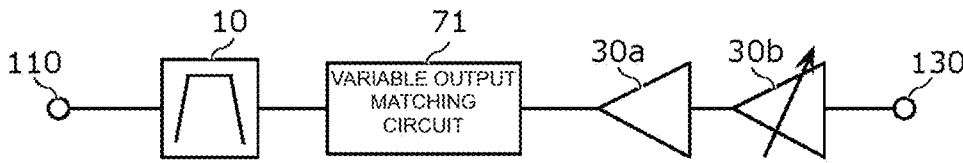
FIG. 3 is diagram illustrating an example of the circuit configuration of a transmission path according to the second example.

FIG. 3 is a diagram illustrating an example of the circuit configuration of the transmission path of the radio-frequency circuit 1B according to the second example. An example of the circuit configuration of the transmission path connecting the radio-frequency input terminal 130 to the antenna con-nection terminal 110 is illustrated in FIG. 3.

As illustrated in FIG. 3, the power amplifier 30 is com-posed of an amplifier 30b (a first amplifier) and an amplifier 30a (a second amplifier) arranged downstream of the ampli-fier 30b. The amplifier 30b and the amplifier 30a are cascade-connected to each other. The power amplifier 40 is composed of an amplifier 40b (a third amplifier) and an amplifier 40a (a fourth amplifier) arranged downstream of the amplifier 40b, although not illustrated in FIG. 3. The amplifier 40b and the amplifier 40a are cascade-connected to each other. In addition, a variable output matching circuit 71 is connected between the filter 10 and the amplifier 30a. A variable output matching circuit 72 is connected between the filter 20 and the amplifier 40a, although not illustrated in FIG. 3.

The variable output matching circuit 71 is an example of the first circuit. The variable output matching circuit 71 is connected between the filter 10 and the power amplifier 30 and adjusts the impedance matching between the power amplifier 30 and the filter 10. The variable output matching circuit 72 is an example of the second circuit. The variable output matching circuit 72 is connected between the filter 20 and the power amplifier 40 and adjusts the impedance matching between the power amplifier 40 and the filter 20.

Figure 4A:
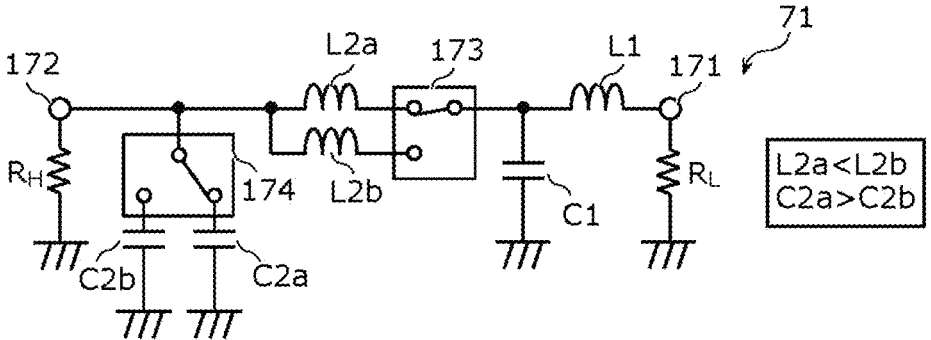
FIG. 4A is a diagram illustrating the circuit configuration in MIMO of a variable output matching circuit according to the second example.

FIG. 4A is a diagram illustrating the circuit configuration in the MIMO of the variable output matching circuit 71 according to the second example. As illustrated in FIG. 4A, the variable output matching circuit 71 includes terminals 171 and 172, inductors L1, L2a, and L2b, capacitors C1, C2a, and C2b, and switches 173 and 174.

The inductor L1 and the switch 173 are arranged in series on a path between the terminal 171 and the terminal 172. The inductors L2a and L2b are connected in parallel between the terminal 172 and the switch 173. The induc-tance value of the inductor L2a is lower than the inductance value of the inductor L2b.

The capacitor C1 is connected between a connection node between the inductor L1 and the switch 173 and ground. The switch 174 and the capacitors C2a and C2b are connected between a connection node between the inductors L2a and L2b and the terminal 172 and the ground. The capacitors C2a and C2b are connected in parallel between the switch 174 and the ground.

The variable output matching circuit 71 has a circuit configuration in which the inductors are arranged on a series arm path and the capacitors are arranged on a parallel arm path. A first impedance converter portion composed of the inductor L1 and the capacitor C1 and a second impedance converter portion composed of the inductors L2a and L2b, the capacitors C2a and C2b, and the switch 173 are arranged in this order from the power amplifier 30 side.

Assuming it is supposed that output impedance ($R_L$) of the power amplifier 30 is lower than input impedance ($R_H$) of the filter 10, the output impedance ($R_L$), the impedance of the first impedance converter portion, the impedance of the second impedance converter portion, and the input imped-ance ($R_H$) are increased in this order to achieve the imped-ance matching between the output impedance ($R_L$) and the input impedance ($R_H$). At this time, assuming series parasitic resistances of similar orders are added to the first impedance converter portion and the second impedance converter por-tion, the influence of the series parasitic resistance on the second impedance converter portion, which has relatively high impedance, is smaller than that on the first impedance converter portion. From this point of view, arranging the second impedance converter portion including the switch 173 at a side farther from the power amplifier 30 (down-stream of the power amplifier 30) than the first impedance converter portion enables the transmission loss caused by switching of the switch 173 to be reduced.

The variable output matching circuit 72 has the same circuit configuration as that of the variable output matching circuit 71.

In the above circuit configuration, in the uplink MIMO, the inductor L1 is connected to the inductor L2a and the inductor L1 is not connected to the inductor L2b by switching the switch 173. In response to this, in the uplink MIMO, the capacitor C2*a* is connected to the terminal 172 and the capacitor C2*b* is not connected to the terminal 172 by switching the switch 174. Similarly, also in the variable output matching circuit 72, in the uplink MIMO, the inductor having a lower inductance value, among the two inductors arranged on the series arm path, is connected to the series arm path and the inductor having a higher inductance value, among the two inductors arranged on the series arm path, is not connected to the series arm path.

With the above configuration, assuming the uplink MIMO is performed, the impedances of the variable output matching circuits 71 and 72 are decreased, compared with those assuming the uplink non-MIMO is performed.

Accordingly, in the uplink MIMO, the impedances of the variable output matching circuits 71 and 72 are decreased to enable the saturated output powers of the power amplifiers 30 and 40 to be increased.

At this time, assuming the uplink MIMO is performed, the gains of the amplifiers 30*b* and 40*b* are increased, compared with those assuming the uplink non-MIMO is performed.

Consequently, the decreasing gains of the power amplifiers 30 and 40 in accordance with the decreasing impedances of the variable output matching circuits 71 and 72 are capable of being avoided by increasing the gains of the amplifiers 30*b* and 40*b*. As a result, it is possible to keep the power level while improving the quality of the transmission signal in the uplink MIMO.

Figure 4B:
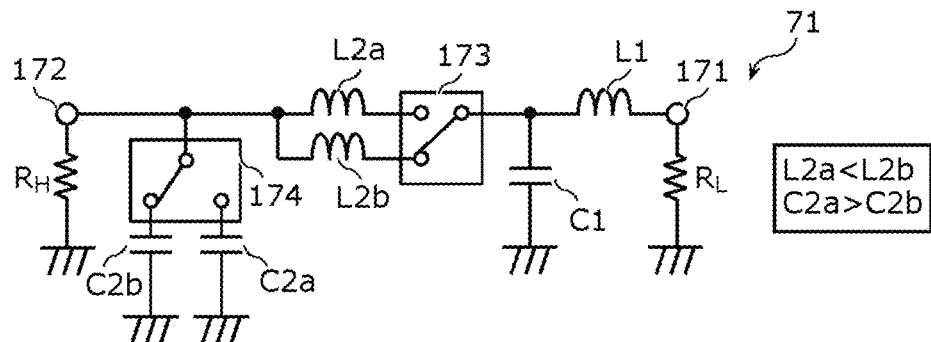
FIG. 4B is a diagram illustrating the circuit configuration in non-MIMO of the variable output matching circuit according to the second example.

FIG. 4B is a diagram illustrating the circuit configuration in the non-MIMO of the variable output matching circuit 71 according to the second example. As illustrated in FIG. 4B, assuming the uplink non-MIMO is performed (in the non-MIMO), the inductor L1 is not connected to the inductor L2*a* and the inductor L1 is connected to the inductor L2*b* by switching the switch 173. In response to this, in the non-MIMO, the capacitor C2*a* is not connected to the terminal 172 and the capacitor C2*b* is connected to the terminal 172 by switching the switch 174. Similarly, also in the variable output matching circuit 72, in the non-MIMO, the inductor having a higher inductance value, among the two inductors arranged on the series arm path, is connected to the series arm path and the inductor having a lower inductance value, among the two inductors arranged on the series arm path, is not connected to the series arm path.

Accordingly, assuming the uplink non-MIMO is performed, the impedances of the variable output matching circuits 71 and 72 are increased, compared with those assuming the uplink MIMO is performed.

Figure 5:
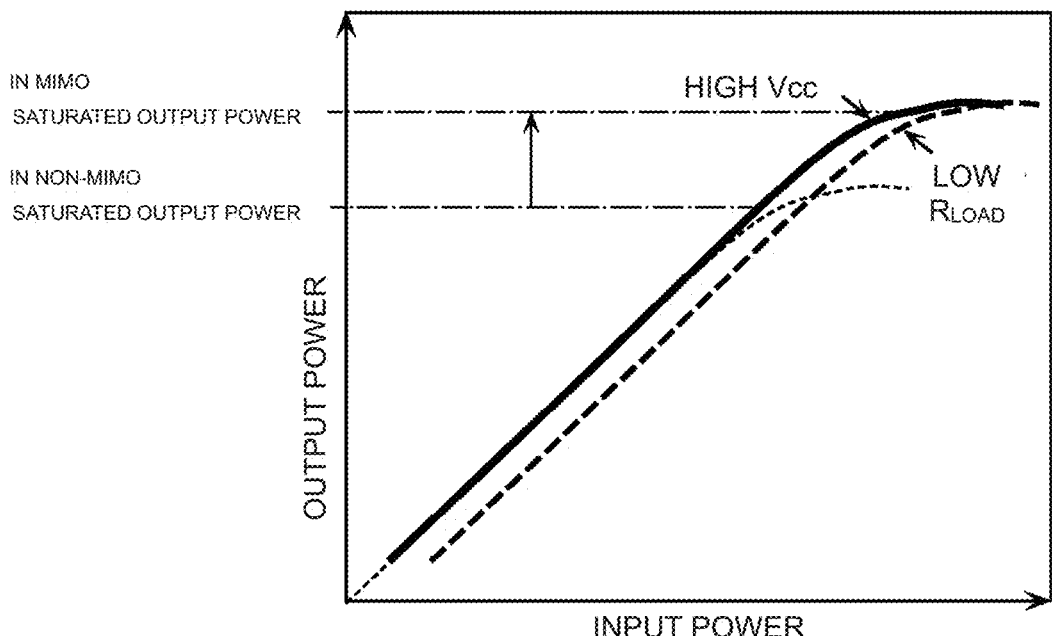
FIG. 5 is a graph indicating a result of comparison between input-output characteristics of power amplifiers in the MIMO and input-output characteristics of the power amplifiers in the non-MIMO.

FIG. 5 is a graph indicating a result of comparison between the input-output characteristics of the power amplifiers 30 and 40 in the MIMO and the input-output characteristics of the power amplifiers 30 and 40 in the non-MIMO. The input power-output power characteristic (a thin broken line) of the power amplifiers 30 and 40 in the non-MIMO, the input power-output power characteristic (a solid line) of the power amplifiers 30 and 40 in the MIMO in the radio-frequency circuit 1A according to the first example, and the input power-output power characteristic (a bold broken line) of the power amplifiers 30 and 40 in the MIMO (only the impedances of the variable output matching circuits 71 and 72 are decreased) in the radio-frequency circuit 1B according to the second example are indicated in FIG. 5.

In the radio-frequency circuit 1A according to the first example, increasing the power supply voltages Vcc1 and Vcc2 increases the saturated output power. At this time, the gain indicated by the ratio between the input power and the output power is hardly varied.

In the radio-frequency circuit 1B according to the second example, decreasing the impedances of the variable output matching circuits 71 and 72 (low $R_{LOAD}$) increases the saturated output power. However, only decreasing the impedances of the variable output matching circuits 71 and 72 decreases the gain. In order to resolve this problem, in the radio-frequency circuit 1B according to the second example, the gains of the amplifiers 30*b* and 40*b* may be increased assuming the uplink MIMO is performed, compared with those assuming the uplink non-MIMO is performed. Accordingly, the decreasing gains of the power amplifiers 30 and 40 in accordance with the decreasing impedances of the variable output matching circuits 71 and 72 are capable of being avoided by increasing the gains of the amplifiers 30*b* and 40*b*.

Figure 6:
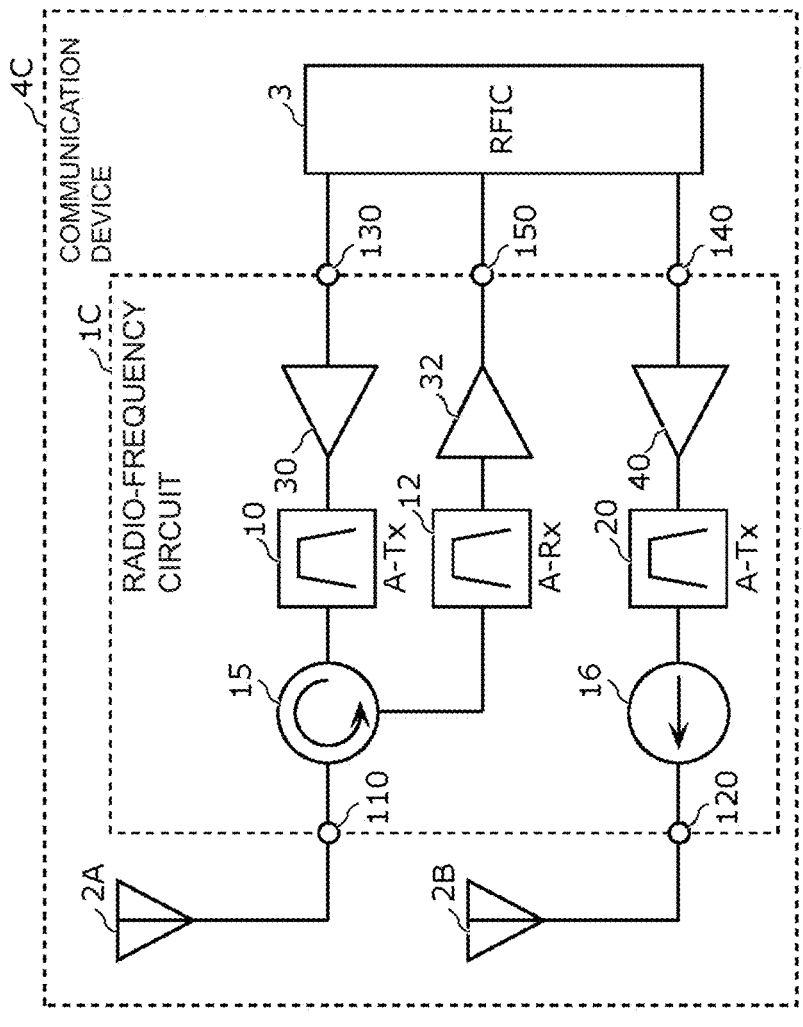
FIG. 6 is a diagram illustrating the circuit configurations of a radio-frequency circuit and a communication device according to a third example.

3. Circuit Configurations of Radio-Frequency Circuit 1C and Communication Device 4C According to Third Example The circuit configurations of a radio-frequency circuit 1C and a communication device 4C according to a third example will now be described with reference to FIG. 6. FIG. 6 is a diagram illustrating the circuit configurations of the radio-frequency circuit 1C and the communication device 4C according to the third example.

3.1 Circuit Configuration of Communication Device 4C

First, the circuit configuration of the communication device 4C will be described. As illustrated in FIG. 6, the communication device 4C according to the third example includes the radio-frequency circuit 1C, the antennas 2A and 2B, and the RFIC 3. The communication device 4C according to the third example differs from the communication device 4A according to the first example only in the configuration of the radio-frequency circuit 1C. Accordingly, the following description focuses on the configuration of the radio-frequency circuit 1C in the communication device 4C according to the third example.

3.2 Circuit Configuration of Radio-Frequency Circuit 1C

Next, the circuit configuration of the radio-frequency circuit 1C will be described. As illustrated in FIG. 6, the radio-frequency circuit 1C includes the power amplifiers 30 and 40, a low noise amplifier 32, a circulator 15, an isolator 16, the filters 10 and 20, a filter 12, the antenna connection terminals 110 and 120, the radio-frequency input terminals 130 and 140, and a radio-frequency output terminal 150. The radio-frequency circuit 1C according to the third example differs from the radio-frequency circuit 1A according to the first example in the configuration of the first circuit and the second circuit. Accordingly, a description of the same points of the radio-frequency circuit 1C according to the third example as those of the radio-frequency circuit 1A according to the first example is omitted, and the following description focuses on points different from the radio-frequency circuit 1A according to the first example.

The filter 10 is an example of the first filter. The filter 10 includes the uplink operating band of Band A (the first band) in its passband. The filter 10 is connected between the antenna connection terminal 110 and the output terminal of the power amplifier 30.

The filter 20 is an example of the second circuit. The filter 20 includes the uplink operating band of Band A (the first band) in its passband. The filter 20 is connected between the antenna connection terminal 120 and the output terminal of the power amplifier 40.

The filter 12 is an example of a third filter. The filter 12 includes the downlink operating band of Band A (the first band) in its passband. The filter 12 is connected between the antenna connection terminal 110 and an input terminal of the low noise amplifier 32.

The low noise amplifier 32 is capable of amplifying a reception signal in Band A supplied from the antenna 2A through the antenna connection terminal 110. The low noise amplifier 32 is connected between the filter 12 and the radio-frequency output terminal 150.

The circulator 15 is an example of the first circuit. A first end of the circulator 15 is connected to the antenna connection terminal 110, a second end thereof is connected to the filter 12, and a third end thereof is connected to the filter 10. The circulator 15 transmits the signal in Band A from the first end to the second end and transmits the signal in Band A from the third end to the first end. In addition, the circulator 15 does not transmit the signal in Band A from the first end to the third end and does not transmit the signal in Band A from the second end to the first end.

With the arrangement of the circulator 15, in the uplink MIMO, intrusion of the transmission signal in Band A output from the antenna 2B into the filter 10 and the power amplifier 30 from the antenna connection terminal 110 through the antenna 2A is suppressed. Accordingly, it is possible to suppress the spurious waves caused by nonlinear distortion occurring at the filter 10 and the power amplifier 30 without degrading bandpass characteristics at the filter 12. Consequently, it is possible to improve the quality of the transmission signal in the uplink MIMO.

The isolator 16 is an example of the second circuit. One end of the isolator 16 is connected to the antenna connection terminal 120 and the other end thereof is connected to the filter 20. The isolator 16 transmits the signal in Band A from the other end to the one end.

With the arrangement of the isolator 16, in the uplink MIMO, intrusion of the transmission signal in Band A output from the antenna 2A into the filter 20 and the power amplifier 40 from the antenna connection terminal 120 through the antenna 2B is suppressed. Accordingly, it is possible to suppress the spurious waves caused by nonlinear distortion occurring at the filter 20 and the power amplifier 40. Consequently, it is possible to improve the quality of the transmission signal in the uplink MIMO.

Figure 7:
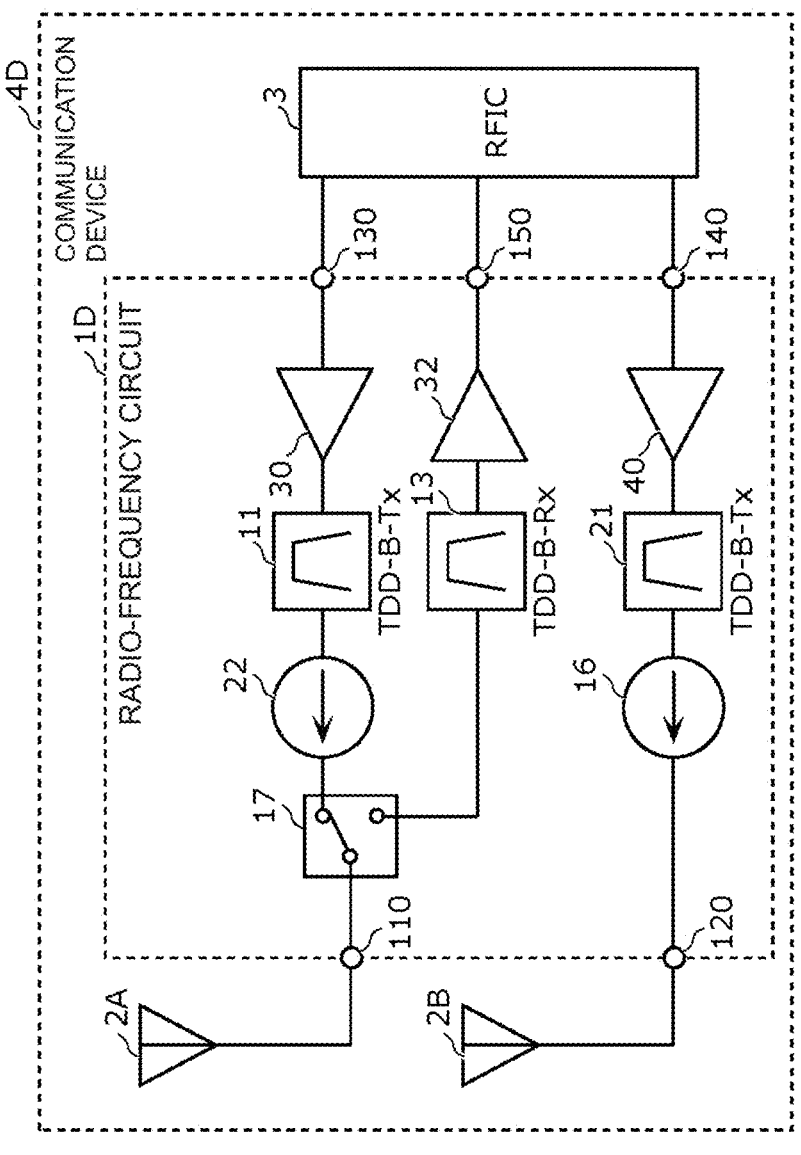
FIG. 7 is a diagram illustrating the circuit configurations of a radio-frequency circuit and a communication device according to a fourth example.

4. Circuit Configurations of Radio-Frequency Circuit 1D and Communication Device 4D According to Fourth Example The circuit configurations of a radio-frequency circuit 1D and a communication device 4D according to a fourth example will now be described with reference to FIG. 7. FIG. 7 is a diagram illustrating the circuit configurations of the radio-frequency circuit 1D and the communication device 4D according to the fourth example.

4.1 Circuit Configuration of Communication Device 4D

First, the circuit configuration of the communication device 4D will be described. As illustrated in FIG. 7, the communication device 4D according to the fourth example includes the radio-frequency circuit 1D, the antennas 2A and 2B, and the RFIC 3. The communication device 4D according to the fourth example differs from the communication device 4C according to the third example only in the configuration of the radio-frequency circuit 1D. Accordingly, the following description focuses on the configuration of the radio-frequency circuit 1D in the communication device 4D according to the fourth example.

4.2 Circuit Configuration of Radio-Frequency Circuit 1D

Next, the circuit configuration of the radio-frequency circuit 1D will be described. As illustrated in FIG. 7, the radio-frequency circuit 1D includes the power amplifiers 30 and 40, the low noise amplifier 32, a switch 17, the isolator 16, an isolator 22, filters 11, 13, and 21, the antenna connection terminals 110 and 120, the radio-frequency input terminals 130 and 140, and the radio-frequency output terminal 150. The radio-frequency circuit 1D according to the fourth example differs from the radio-frequency circuit 1C according to the third example in the configuration of the first circuit. Accordingly, a description of the same points of the radio-frequency circuit 1D according to the fourth example as those of the radio-frequency circuit 1C according to the third example is omitted, and the following description focuses on points different from the radio-frequency circuit 1C according to the third example.

The filter 11 is an example of the first filter and includes Band B (the first band) in its passband. Band B is a band for the TDD. The filter 11 is connected between the antenna connection terminal 110 and the output terminal of the power amplifier 30.

The filter 21 is an example of the second filter and includes Band B (the first band) in its passband. The filter 21 is connected between the antenna connection terminal 120 and the output terminal of the power amplifier 40.

The filter 13 is an example of the third filter and includes Band B (the first band) in its passband. The filter 13 is connected between the antenna connection terminal 110 and the input terminal of the low noise amplifier 32.

The low noise amplifier 32 is capable of amplifying the reception signal in Band B supplied from the antenna 2A through the antenna connection terminal 110. The low noise amplifier 32 is connected between the filter 13 and the radio-frequency output terminal 150.

The switch 17 is arranged between the antenna connection terminal 110 and the filters 11 and 13 and switches between connection between the antenna connection terminal 110 and the filter 11 and connection between the antenna connection terminal 110 and the filter 13. In other words, the switch 17 is a TDD switch that switches between connection between the antenna 2A and the transmission path and connection between the antenna 2A and the reception path.

The isolator 22 is an example of the first circuit. One end of the isolator 22 is connected to the antenna connection terminal 110 via the switch 17 and the other end thereof is connected to the filter 11. The isolator 22 transmits the signal in Band B from the other end to the one end.

With the arrangement of the isolator 22, in the uplink MIMO, intrusion of the transmission signal in Band B output from the antenna 2B into the filter 11 and the power amplifier 30 from the antenna connection terminal 110 through the antenna 2A is suppressed. Accordingly, it is possible to suppress the spurious waves caused by nonlinear distortion occurring at the filter 11 and the power amplifier 30. Consequently, it is possible to improve the quality of the transmission signal in the uplink MIMO.

Band B is any of, for example, Band 41 for the 4G-LTE, Band n41 for the 5G-NR, Band n77 for the 5G-NR, Band n78 for 5G-NR, and Band n79 for the 5G-NR.

Figure 8:
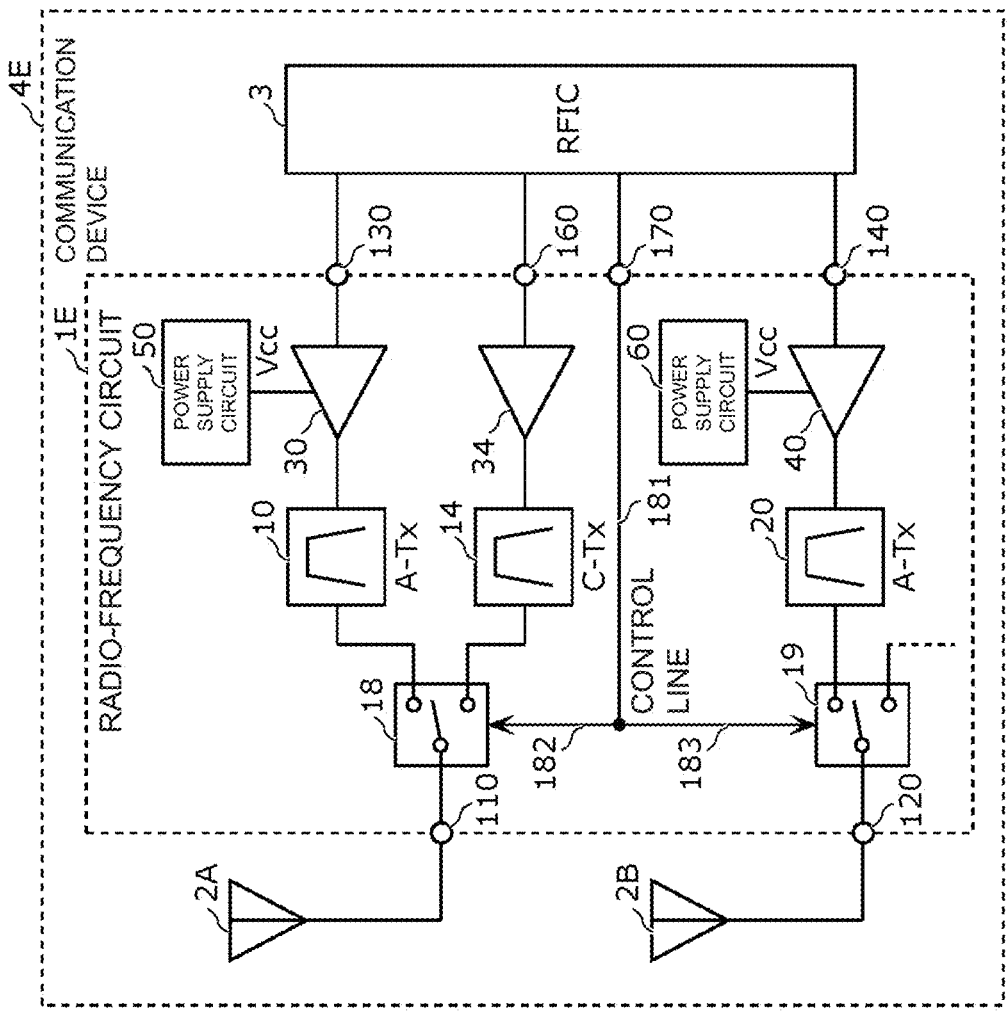
FIG. 8 is a diagram illustrating the circuit configurations of a radio-frequency circuit and a communication device according to a fifth example.

5. Circuit Configurations of Radio-Frequency Circuit 1E and Communication Device 4E According to Fifth Example The circuit configurations of a radio-frequency circuit 1E and a communication device 4E according to a fifth example will now be described with reference to FIG. 8. FIG. 8 is a diagram illustrating the circuit configurations of the radio-frequency circuit 1E and the communication device 4E according to the fifth example.

5.1 Circuit Configuration of Communication Device 4E

First, the circuit configuration of the communication device 4E will be described. As illustrated in FIG. 8, the communication device 4E according to the fifth example includes the radio-frequency circuit 1E, the antennas 2A and 2B, and the RFIC 3. The communication device 4E according to the fifth example differs from the communication device 4A according to the first example only in the configuration of the radio-frequency circuit 1E. Accordingly, the following description focuses on the configuration of the radio-frequency circuit 1E in the communication device 4E according to the fifth example.

5.2 Circuit Configuration of Radio-Frequency Circuit 1E

Next, the circuit configuration of the radio-frequency circuit 1E will be described. As illustrated in FIG. 8, the radio-frequency circuit 1E includes the power amplifiers 30 and 40, a power amplifier 34, the power supply circuits 50 and 60, the filters 10 and 20, a filter 14, switches 18 and 19, the antenna connection terminals 110 and 120, the radio-frequency input terminals 130 and 140, a radio-frequency input terminal 160, and a control signal terminal 170. The radio-frequency circuit 1E according to the fifth example differs from the radio-frequency circuit 1A according to the first example in that the filter 14, the power amplifier 34, the switches 18 and 19, and control lines are added. Accordingly, a description of the same points of the radio-frequency circuit 1E according to the fifth example as those of the radio-frequency circuit 1A according to the first example is omitted, and the following description focuses on points different from the radio-frequency circuit 1A according to the first example.

The filter 14 includes at least part of Band C in its passband. The filter 14 is connected between the antenna connection terminal 110 and an output terminal of the power amplifier 34.

The switch 18 is an example of a first switch and is arranged between the antenna connection terminal 110 and the filters 10 and 14. The switch 18 is connected to a control line 182, which is an example of a first control line. The switch 18 switches between connection and non-connection between the antenna connection terminal 110 and the filter 10 and switches between connection and non-connection between the antenna connection terminal 110 and the filter 14 based on a control signal from the RFIC 3. The control signal is supplied from the RFIC 3 to the switch 18 through the control signal terminal 170, a common control line 181, and the control line 182. One end of the common control line 181 is connected to the control signal terminal 170. The control line 182 is connected to the other end of the common control line 181 and the switch 18.

The switch 19 is an example of a second switch and is arranged between the antenna connection terminal 120 and the filter 20. The switch 19 is connected to a control line 183, which is an example of a second control line. The switch 19 switches between connection and non-connection between the antenna connection terminal 120 and the filter 20 based on the control signal from the RFIC 3. The control signal is supplied from the RFIC 3 to the switch 19 through the control signal terminal 170, the common control line 181, and the control line 183. One end of the common control line 181 is connected to the control signal terminal 170. The control line 183 is connected to the other end of the common control line 181 and the switch 19.

The power amplifier 34 is capable of amplifying a transmission signal in Band C supplied from the RFIC 3 through the radio-frequency input terminal 160. The power amplifier 34 is connected between the filter 14 and the radio-frequency input terminal 160.

Band A is, for example, Band 1 for the 4G-LTE or Band n1 (the uplink operating band: 1,920 MHz to 1,980 MHz and the downlink operating band: 2,110 MHz to 2,170 MHz) for the 5G-NR. Band C is, for example, Band 3 for the 4G-LTE or Band n3 (the uplink operating band: 1,710 MHz to 1,785 MHz and the downlink operating band: 1,805 MHz to 1,880 MHz) for the 5G-NR.

In the above circuit configuration, assuming the uplink MIMO of Band A is performed, the antenna connection terminal 110 is connected to the filter 10 and the antenna connection terminal 120 is connected to the filter 20 by switching the switches 18 and 19. At this time, the power supply voltage Vcc1 is increased and the power supply voltage Vcc2 is increased, compared with those assuming the uplink non-MIMO is performed. Accordingly, assuming the uplink MIMO is performed, the saturated output powers of the power amplifiers 30 and 40 are increased.

In other words, in the uplink MIMO described above, increasing the saturated output powers of the power amplifiers 30 and 40 enables the spurious waves caused by nonlinear distortion, which occurs due to the mutual interference between the two transmission signals, to be suppressed. Accordingly, it is possible to improve the quality of the transmission signal in the uplink MIMO.

In addition, in the uplink MIMO, the switches 18 and 19 are capable of being synchronously switched with the common control line 181. Accordingly, it is possible to realize the uplink MIMO with the simplified configuration.

Furthermore, in the simultaneous transmission of the transmission signal in Band A and the transmission signal in Band C, the antenna connection terminal 110 is connected to the filter 14 and the antenna connection terminal 120 is connected to the filter 20 by switching the switches 18 and 19. At this time, the power supply voltage Vcc1 is decreased and the power supply voltage Vcc2 is decreased, compared with those assuming the uplink MIMO is performed.

6. Advantages and So On

As described above, the radio-frequency circuits 1A, 1B, 1C, 1D, and 1E according to the present embodiment are capable of performing the uplink MIMO of the first band. The radio-frequency circuit 1A, 1B, 1C, 1D, and 1E each include the power amplifier 30 capable of amplifying a signal in the first band, the first circuit capable of adjusting the linearity of output power with respect to input power into the power amplifier 30, the power amplifier 40 capable of amplifying a signal in the first band, and the second circuit capable of adjusting the linearity of output power with respect to input power into the power amplifier 40. Assuming the uplink MIMO is performed using the first transmission signal output from the power amplifier 30 and the second transmission signal output from the power amplifier 40, the saturated output powers of the power amplifiers 30 and 40 are increased due to the first circuit and the second circuit.

Assuming the uplink MIMO of the first band is performed, the multiple transmission signals in the first band are transmitted using the same channel in the first band. Accordingly, it is difficult to ensure sufficient isolation between the multiple transmission paths, compared with the non-MIMO. Consequently, there is a problem in that the spurious waves caused by nonlinear distortion are likely to occur on the multiple transmission paths.

In contrast, with the above configuration, the saturated output powers of the power amplifiers 30 and 40 are increased due to the first circuit and the second circuit in the uplink MIMO. Accordingly, in the uplink MIMO, increasing the saturated output powers of the power amplifiers 30 and 40 enables the spurious waves caused by nonlinear distortion, which occurs due to the mutual interference between the first transmission signal and the second transmission signal, to be suppressed. Consequently, it is possible to improve the quality of the transmission signal in the uplink MIMO.

For example, the radio-frequency circuit 1A may further include the antenna connection terminals 110 and 120, the filter 10 that is connected between the antenna connection terminal 110 and the power amplifier 30 and that includes at least part of the first band in its passband, and the filter 20 that is connected between the antenna connection terminal 120 and the power amplifier 40 and that includes at least part of the first band in its passband. The first circuit (the power supply circuit 50) may be connected to the power amplifier 30 and may supply the power supply voltage Vcc1 to the power amplifier 30. The second circuit (the power supply circuit 60) may be connected to the power amplifier 40 and may supply the power supply voltage Vcc2 to the power amplifier 40. Assuming the uplink MIMO is performed, the power supply voltages Vcc1 and Vcc2 may be increased, compared with those assuming the uplink non-MIMO is performed.

With the above configuration, in the power supply circuit 50, assuming the uplink MIMO is performed, the power supply voltages Vcc1 and Vcc2 are increased, compared with those assuming the uplink non-MIMO is performed. Accordingly, the saturated output powers of the power amplifiers 30 and 40 are increased assuming the uplink MIMO is performed. Consequently, it is possible to suppress the spurious waves caused by nonlinear distortion, which occurs due to the mutual interference between the first transmission signal and the second transmission signal.

For example, the radio-frequency circuit 1B may further include the antenna connection terminals 110 and 120, the filter 10 that is connected between the antenna connection terminal 110 and the power amplifier 30 and that includes at least part of the first band in its passband, and the filter 20 that is connected between the antenna connection terminal 120 and the power amplifier 40 and that includes at least part of the first band in its passband. The first circuit (the load impedance circuit 70) may be connected between the filter 10 and the power amplifier 30. The second circuit (the load impedance circuit 80) may be connected between the filter 20 and the power amplifier 40. Assuming the uplink MIMO is performed, the impedance of the first circuit and the impedance of the second circuit may be different from those assuming the uplink non-MIMO is performed.

With the above configuration, in the uplink MIMO, the impedance of the load impedance circuit 70 assuming the power amplifier 30 side is viewed is capable of being decreased. In addition, in the uplink MIMO, the impedance of the load impedance circuit 80 assuming the power amplifier 40 side is viewed is capable of being decreased. Accordingly, increasing the saturated output powers of the power amplifiers 30 and 40 enables the spurious waves caused by nonlinear distortion, which occurs in the uplink MIMO, to be suppressed.

For example, in the radio-frequency circuit 1B, the power amplifier 30 may include the amplifier 30b and the amplifier 30a arranged downstream of the amplifier 30b. The amplifier 30b is cascade-connected to the amplifier 30a. The power amplifier 40 may include the amplifier 40b and the amplifier 40a arranged downstream of the amplifier 40b. The amplifier 40b is cascade-connected to the amplifier 40a. Assuming the uplink MIMO is performed, the impedance of the first circuit (the variable output matching circuit 71) may be decreased, the impedance of the second circuit (the variable output matching circuit 72) may be decreased, and the gains of the amplifiers 30b and 40b may be increased, compared with those assuming the uplink non-MIMO is performed.

With the above configuration, since the impedances of the variable output matching circuits 71 and 72 are decreased assuming the uplink MIMO is performed, compared with those assuming the uplink non-MIMO is performed, the saturated output powers of the power amplifiers 30 and 40 are capable of being increased. In addition, since the gains of the amplifiers 30b and 40b are increased, compared with those assuming the uplink non-MIMO is performed, the decreasing gains of the power amplifiers 30 and 40 in accordance with the decreasing impedances of the variable output matching circuits 71 and 72 are capable of being avoided by increasing the gains of the amplifiers 30b and 40b. Accordingly, it is possible to keep the power level while improving the quality of the transmission signal in the uplink MIMO.

For example, the radio-frequency circuit 1C may further include the antenna connection terminals 110 and 120, the filter 10 that is connected between the antenna connection terminal 110 and the power amplifier 30 and that includes at least part of the first band in its passband, and the filter 20 that is connected between the antenna connection terminal 120 and the power amplifier 40 and that includes at least part of the first band in its passband. The second circuit may be the isolator 16 the first end of which is connected to the antenna connection terminal 120, the second end of which is connected to the filter 20, which transmits a signal in the first band from the second end to the first end.

With the above configuration, in the uplink MIMO, intrusion of the transmission signal in Band A output from the antenna 2A into the filter 20 and the power amplifier 40 from the antenna connection terminal 120 through the antenna 2B is avoided. Accordingly, it is possible to suppress the spurious waves caused by nonlinear distortion occurring at the filter 20 and the power amplifier 40.

For example, the radio-frequency circuit 1C may further include the low noise amplifier 32 capable of amplifying a signal in the first band, the antenna connection terminals 110 and 120, the filter 10 that is connected between the antenna connection terminal 110 and the power amplifier 30 and that includes the uplink operating band of the first band in its passband, the filter 20 that is connected between the antenna connection terminal 120 and the power amplifier 40 and that includes the uplink operating band of the first band in its passband, and the filter 12 that is connected between the antenna connection terminal 110 and the low noise amplifier 32 and that includes the downlink operating band of the first band in its passband. The first circuit may be the circulator 15 the first end of which is connected to the antenna connection terminal 110, the second end of which is connected to the filter 12, the third end of which is connected to the filter 10, and which transmits a signal in the first band from the first end to the second end and transmits a signal in the first band from the third end to the first end.

With the above configuration, in the uplink MIMO, intrusion of the transmission signal in Band A output from the antenna 2B into the filter 10 and the power amplifier 30 from the antenna connection terminal 110 through the antenna 2A is avoided. Accordingly, it is possible to suppress the spurious waves caused by nonlinear distortion occurring at the filter 10 and the power amplifier 30 without degrading the bandpass characteristics at the filter 12. Consequently, it is possible to improve the quality of the transmission signal in the uplink MIMO.

For example, the radio-frequency circuit 1E may further include the antenna connection terminals 110 and 120, the control signal terminal 170, the filter 10 that is connected between the antenna connection terminal 110 and the power amplifier 30 and that includes at least part of the first band in its passband, the filter 20 that is connected between the antenna connection terminal 120 and the power amplifier 40 and that includes at least part of the first band in its passband, the switch 18 that is connected between the antenna connection terminal 110 and the filter 10 and that switches between connection and non-connection between the antenna connection terminal 110 and the filter 10, the switch 19 that is connected between the antenna connection terminal 120 and the filter 20 and that switches between connection and non-connection between the antenna connection terminal 120 and the filter 20, the common control line 181 having the first end connected to the control signal terminal 170, the control line 182 connected to the second end of the common control line 181 and the switch 18, and the control line 183 connected to the second end of the common control line 181 and the switch 19.

With the above configuration, in the uplink MIMO, the switches 18 and 19 are capable of being synchronously switched with the common control line 181. Accordingly, it is possible to realize the uplink MIMO with the simplified configuration.

For example, in the radio-frequency circuits 1A, 1B, 1C, and 1E, the first band may be Band 1.

For example, in the radio-frequency circuit 1D, the first band may be any of Band 41 for the 4G-LTE, Band n41 for the 5G-NR, Band n77 for the 5G-NR, Band n78 for the 5G-NR, and Band n79 for the 5G-NR.

The communication device 4A according to the present embodiment includes the RFIC 3 that processes the radio-frequency signal and the radio-frequency circuit 1A that transmits the radio-frequency signal between the RFIC 3 and the antennas 2A and 2B.

With the above configuration, the communication device 4A is capable of achieving the same advantages as the above advantages of the radio-frequency circuit 1A.

Other Embodiments

Although the radio-frequency circuits and the communication devices according to the present invention are described based on the examples, the radio-frequency circuits and the communication devices according to the present invention are not limited to the above examples. Other examples realized by combining arbitrary components in the above examples, modifications achieved by making various modifications supposed by the person skilled in the art to the above examples without departing from the spirit and scope of the present invention, and various devices incorporating the radio-frequency circuits and the communication devices described above are also included in the present invention.

For example, in the circuit configurations of the radio-frequency circuits and the communication devices according to the above examples, other circuit elements, lines, and so on may be provided between the paths with which the respective circuit elements and signal paths illustrated in the drawings are connected.

Although the bands for the 5G-NR or the LTE are used in the above embodiments, communication bands for other radio access technologies may be used, in addition to or instead of the 5G-NR or the LTE. For example, a communication band for a wireless local area network may be used. In addition, for example, a millimeter wave band of 7 GHz or higher may be used. In this case, any of the radio-frequency circuits 1A to 1E, the antennas 2A and 2B, and the RFIC 3 compose a millimeter wave antenna module and, for example, a distributed constant filter may be used as the filter.

The present invention is widely usable for a communication device, such as a mobile phone, as a multiband-multimode front-end module adopting the MIMO method.

What is claimed is:

1. A radio-frequency circuit capable of performing in a multiple-input multiple-output (MIMO) uplink mode and a non-MIMO uplink mode, wherein the MIMO uplink mode includes performing uplink multiple-input multiple-output of a first band, the radio-frequency circuit comprising:
   a first power amplifier capable of amplifying a signal in the first band;
   a first circuit capable of adjusting a linearity of an output power of the first power amplifier with respect to an input power into the first power amplifier;
   a second power amplifier capable of amplifying a signal in the first band; and
   a second circuit capable of adjusting a linearity of an output power of the second power amplifier with respect to an input power into the second power amplifier,
   wherein, in the MIMO uplink mode, upon performing the uplink multiple-input multiple-output of the first band using a first transmission signal output from the first power amplifier and a second transmission signal output from the second power amplifier, saturated output powers of the first power amplifier and the second power amplifier are increased due to the first circuit and the second circuit.

2. The radio-frequency circuit according to claim 1, further comprising:
   a first antenna connection terminal and a second antenna connection terminal;
   a first filter that is connected between the first antenna connection terminal and the first power amplifier and that includes at least part of the first band in its passband; and
   a second filter that is connected between the second antenna connection terminal and the second power amplifier and that includes at least part of the first band in its passband,
   wherein the first circuit is connected to the first power amplifier and supplies first power supply voltage to the first power amplifier,
   wherein the second circuit is connected to the second power amplifier and supplies second power supply voltage to the second power amplifier, and
   wherein, upon performing the MIMO uplink mode, the first power supply voltage is increased and the second power supply voltage is increased, compared to a situation where the non-MIMO uplink mode is performed.

3. The radio-frequency circuit according to claim 1, further comprising:
   a first antenna connection terminal and a second antenna connection terminal;
   a first filter that is connected between the first antenna connection terminal and the first power amplifier and that includes at least part of the first band in its passband; and a second filter that is connected between the second antenna connection terminal and the second power amplifier and that includes at least part of the first band in its passband, wherein the first circuit is connected between the first filter and the first power amplifier, wherein the second circuit is connected between the second filter and the second power amplifier, and wherein, upon performing the MIMO uplink mode, impedance of the first circuit and impedance of the second circuit are different from a situation where the non-MIMO uplink mode is performed.

4. The radio-frequency circuit according to claim 3, wherein the first power amplifier includes a first amplifier and a second amplifier arranged downstream of the first amplifier, the first amplifier being cascade-connected to the second amplifier, wherein the second power amplifier includes a third amplifier and a fourth amplifier arranged downstream of the third amplifier, the third amplifier being cascade-connected to the fourth amplifier, and wherein, upon performing the MIMO uplink mode, the impedance of the first circuit is decreased, the impedance of the second circuit is decreased, and gains of the first amplifier and the third amplifier are increased, compared to a situation where the non-MIMO uplink mode is performed.

5. The radio-frequency circuit according to claim 1, further comprising:

a first antenna connection terminal and a second antenna connection terminal;

a first filter that is connected between the first antenna connection terminal and the first power amplifier and that includes at least part of the first band in its passband; and a second filter that is connected between the second antenna connection terminal and the second power amplifier and that includes at least part of the first band in its passband, wherein the second circuit is an isolator a first end of which is connected to the second antenna connection terminal, a second end of which is connected to the second filter, which transmits a signal in the first band from the second end to the first end.

6. The radio-frequency circuit according to claim 1, further comprising:

a low noise amplifier capable of amplifying a signal in the first band;

a first antenna connection terminal and a second antenna connection terminal;

a first filter that is connected between the first antenna connection terminal and the first power amplifier and that includes an uplink operating band of the first band in its passband;

a second filter that is connected between the second antenna connection terminal and the second power amplifier and that includes the uplink operating band of the first band in its passband; and a third filter that is connected between the first antenna connection terminal and the low noise amplifier and that includes a downlink operating band of the first band in its passband, wherein the first circuit is a circulator a first end of which is connected to the first antenna connection terminal, a second end of which is connected to the third filter, a third end of which is connected to the first filter, and which transmits a signal in the first band from the first end to the second end and transmits a signal in the first band from the third end to the first end.

7. The radio-frequency circuit according to claim 1, further comprising:

a first antenna connection terminal and a second antenna connection terminal;

a control signal terminal;

a first filter that is connected between the first antenna connection terminal and the first power amplifier and that includes at least part of the first band in its passband;

a second filter that is connected between the second antenna connection terminal and the second power amplifier and that includes at least part of the first band in its passband;

a first switch that is connected between the first antenna connection terminal and the first filter and that switches between connection and non-connection between the first antenna connection terminal and the first filter;

a second switch that is connected between the second antenna connection terminal and the second filter and that switches between connection and non-connection between the second antenna connection terminal and the second filter;

a common control line having a first end connected to the control signal terminal;

a first control line connected to a second end of the common control line and the first switch; and a second control line connected to the second end of the common control line and the second switch.

8. The radio-frequency circuit according to claim 1, wherein the first band is Band 1.

9. The radio-frequency circuit according to claim 1, wherein the first band is any of Band 41 for 4th Generation-Long Term Evolution, Band n41 for 5th Generation-New Radio, Band n77 for the 5th Generation-New Radio, Band n78 for the 5th Generation-New Radio, and Band n79 for the 5th Generation-New Radio.

10. A communication device comprising:

a signal processing circuit that processes a radio-frequency signal; and the radio-frequency circuit according to claim 1, which transmits the radio-frequency signal between the signal processing circuit and an antenna.

11. A method of operating a radio-frequency circuit capable of performing in a multiple-input multiple-output (MIMO) uplink mode and a non-MIMO uplink mode, wherein the MIMO uplink mode includes performing uplink multiple-input multiple-output of a first band, the radio-frequency circuit comprising a first power amplifier, and a second power amplifier, the method comprising:

amplifying a signal in the first band via the first power amplifier;

adjusting a linearity of an output power of the first power amplifier with respect to an input power into the first power amplifier;

amplifying a signal in the first band via the second power amplifier; and adjusting a linearity of an output power of the second power amplifier with respect to an input power into the second power amplifier, wherein, in the MIMO uplink mode, upon performing the uplink multiple-input multiple-output of the first band using a first transmission signal output from the first power amplifier and a second transmission signal output from the second power amplifier, saturated output powers of the first power amplifier and the second power amplifier are increased due to a first circuit and a second circuit.

12. The method according to claim 11, wherein the radio-frequency circuit further includes a first antenna connection terminal and a second antenna connection terminal, a first filter that is connected between the first antenna connection terminal and the first power amplifier and that includes at least part of the first band in its passband; and a second filter that is connected between the second antenna connection terminal and the second power amplifier and that includes at least part of the first band in its passband, wherein the first circuit is connected to the first power amplifier and supplies first power supply voltage to the first power amplifier, wherein the second circuit is connected to the second power amplifier and supplies second power supply voltage to the second power amplifier, the method comprising:

upon performing the MIMO uplink mode, the first power supply voltage is increased and the second power supply voltage is increased, compared to a situation where the non-MIMO uplink mode is performed.

13. The method according to claim 11, wherein the radio-frequency circuit further includes a first antenna connection terminal and a second antenna connection terminal; a first filter that is connected between the first antenna connection terminal and the first power amplifier and that includes at least part of the first band in its passband; and a second filter that is connected between the second antenna connection terminal and the second power amplifier and that includes at least part of the first band in its passband, wherein the first circuit is connected between the first filter and the first power amplifier, wherein the second circuit is connected between the second filter and the second power amplifier, the method comprising:

upon performing the MIMO uplink mode, impedance of the first circuit and impedance of the second circuit are different from a situation where the non-MIMO uplink mode is performed.

14. The method according to claim 13, wherein the first power amplifier includes a first amplifier and a second amplifier arranged downstream of the first amplifier, the first amplifier being cascade-connected to the second amplifier, wherein the second power amplifier includes a third amplifier and a fourth amplifier arranged downstream of the third amplifier, the third amplifier being cascade-connected to the fourth amplifier, the method comprising:

upon performing the MIMO uplink mode, the impedance of the first circuit is decreased, the impedance of the second circuit is decreased, and gains of the first amplifier and the third amplifier are increased, compared to a situation where the non-MIMO uplink mode is performed.

15. The method according to claim 11, wherein the first band is Band 1.

16. The method according to claim 11, wherein the first band is any of Band 41 for 4th Generation-Long Term Evolution, Band n41 for 5th Generation-New Radio, Band n77 for the 5th Generation-New Radio, Band n78 for the 5th Generation-New Radio, and Band n79 for the 5th Generation-New Radio.

17. A non-transitory computer product containing instructions for a method of operating a radio-frequency circuit capable of performing in a multiple-input multiple-output (MIMO) uplink mode and a non-MIMO uplink mode, wherein the MIMO uplink mode includes performing uplink multiple-input multiple-output of a first band, the radio-frequency circuit comprising a first power amplifier, and a second power amplifier, the method comprising:

adjusting a linearity of an output power of the first power amplifier with respect to an input power into the first power amplifier; and adjusting a linearity of an output power of the second power amplifier with respect to an input power into the second power amplifier, wherein, in the MIMO uplink mode, upon performing the uplink multiple-input multiple-output of the first band using a first transmission signal output from the first power amplifier and a second transmission signal output from the second power amplifier, saturated output powers of the first power amplifier and the second power amplifier are increased due to a first circuit and a second circuit.

* * * * *